US010418154B2

(12) United States Patent
Betz et al.

(10) Patent No.: US 10,418,154 B2
(45) Date of Patent: Sep. 17, 2019

(54) SUPERCONDUCTING STRUCTURE FOR CONNECTING TAPE CONDUCTORS, IN PARTICULAR HAVING A CORRUGATED OR SERRATED SEAM

(71) Applicant: Bruker HTS GmbH, Hanau (DE)

(72) Inventors: Ulrich Betz, Alzenau (DE); Alexander Usoskin, Hanau (DE)

(73) Assignee: BRUKER HTS GMBH, Hanau (DE)

( * ) Notice: Subject to any disclaimer, the term of this patent is extended or adjusted under 35 U.S.C. 154(b) by 570 days.

(21) Appl. No.: 15/293,832

(22) Filed: Oct. 14, 2016

(65) Prior Publication Data

US 2019/0228893 A1 Jul. 25, 2019

(30) Foreign Application Priority Data

Oct. 14, 2015 (DE) .................. 10 2015 219 956

(51) Int. Cl.
H01B 12/02 (2006.01)
H01B 12/06 (2006.01)
H01F 6/06 (2006.01)

(52) U.S. Cl.
CPC ............. H01B 12/02 (2013.01); H01B 12/06 (2013.01); H01F 6/06 (2013.01)

(58) Field of Classification Search
CPC .......... H01B 12/02; H01B 12/06; H01R 4/68; H01F 6/06
See application file for complete search history.

(56) References Cited

U.S. PATENT DOCUMENTS

| 5,358,929 A * | 10/1994 | Fujikami ................. H01F 6/065 228/179.1 |
| 6,133,814 A | 10/2000 | Okada et al. |
| 8,195,260 B2 | 6/2012 | Otto et al. |
| 9,159,897 B2 | 10/2015 | Schlenga et al. |
| 2012/0108435 A1* | 5/2012 | Ichiki ..................... H02G 15/34 505/230 |

(Continued)

FOREIGN PATENT DOCUMENTS

DE 102012218251 A1 4/2014
DE 102013220141 A1 4/2015

(Continued)

*Primary Examiner* — Timothy J Thompson
*Assistant Examiner* — Amol H Patel
(74) *Attorney, Agent, or Firm* — Edell, Shapiro & Finnan, LLC

(57) ABSTRACT

A superconductor structure (10, 20, 30), having a first strip piece (1), a second strip piece (2) and a third strip piece (3). Each strip piece has a substrate (5) and a superconducting layer (6) deposited thereon. End sections of the second and third strip pieces are connected via a layer (7) made of a first normally conducting material to the first strip piece, the second and third strip pieces overlap with the first strip piece, the superconducting layers of the second and third strip pieces face the superconducting layer of the first strip piece, and a seam (4, 23, 24) with a defined path length is formed between the end sections of the second and third strip pieces. The seam extends over an extension region (8) of the superconductor structure. Splicing strip pieces together in this manner achieves a high current load capacity.

26 Claims, 4 Drawing Sheets

(56) References Cited

U.S. PATENT DOCUMENTS

| | | | |
|---|---|---|---|
| 2013/0203604 A1* | 8/2013 | Usoskin | H01B 12/02 505/230 |
| 2014/0100119 A1* | 4/2014 | Schlenga | H01L 41/06 505/236 |
| 2015/0045229 A1* | 2/2015 | Mitsuhashi | H02G 15/34 505/230 |
| 2015/0357089 A1* | 12/2015 | Oh | H01L 39/02 505/237 |
| 2016/0216348 A1 | 7/2016 | Roth et al. | |
| 2018/0025812 A1* | 1/2018 | Ohki | H01B 12/06 29/599 |
| 2018/0218809 A1* | 8/2018 | Nakai | H01F 6/06 |

FOREIGN PATENT DOCUMENTS

| | | |
|---|---|---|
| EP | 0 501 394 A2 | 9/1992 |
| EP | 0 556 837 A1 | 8/1993 |
| JP | 2014154320 A | 8/2014 |

* cited by examiner

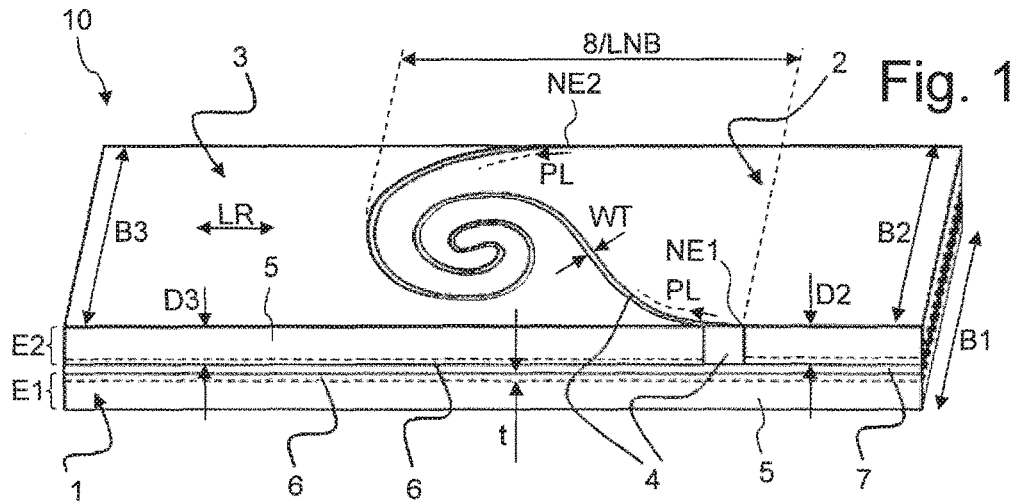
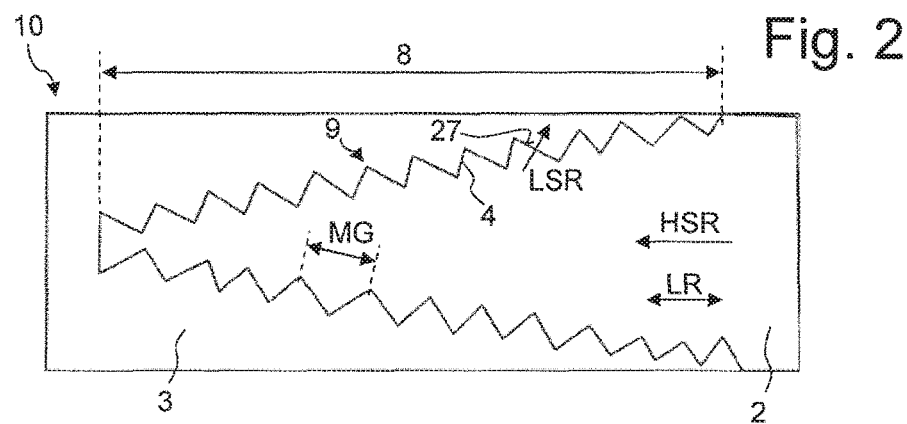
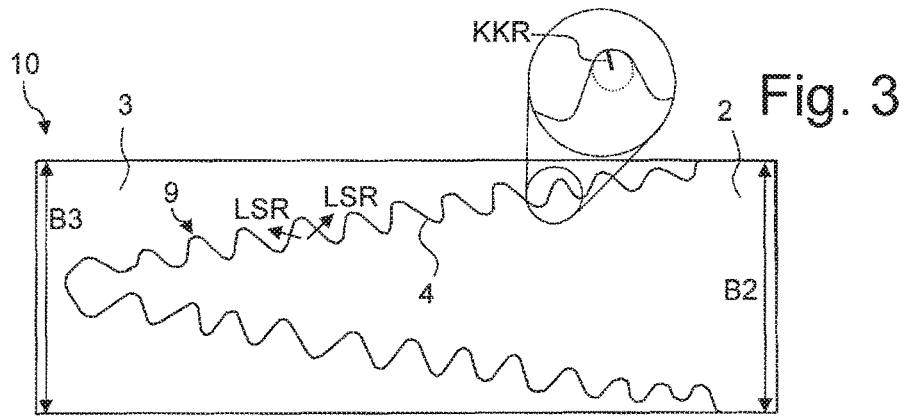

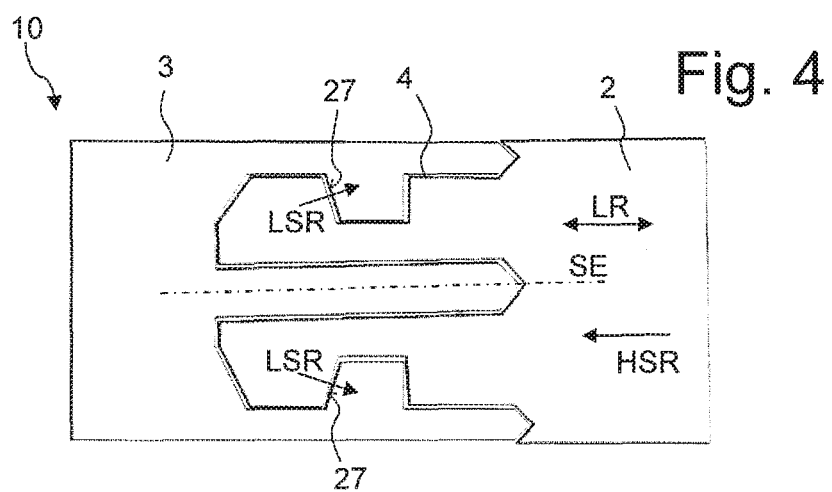
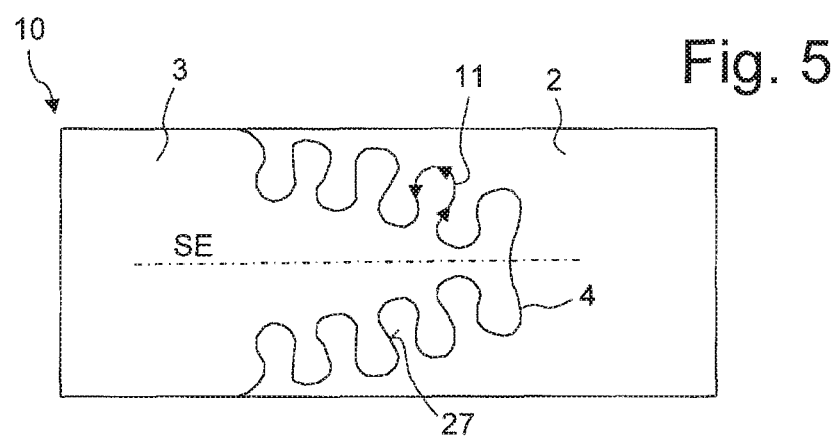

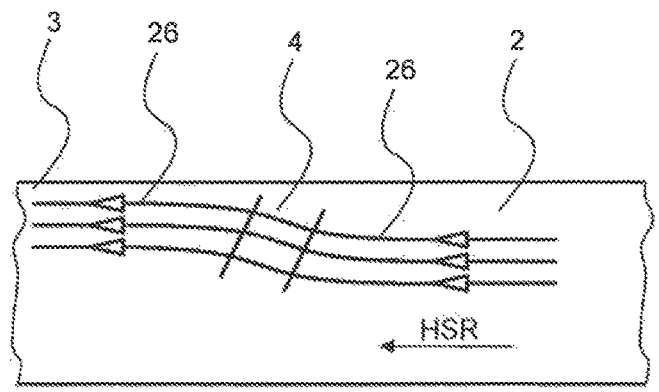
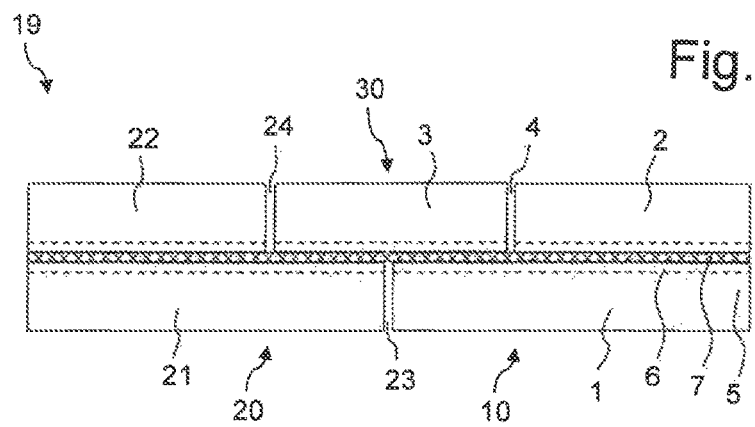

SUPERCONDUCTING STRUCTURE FOR CONNECTING TAPE CONDUCTORS, IN PARTICULAR HAVING A CORRUGATED OR SERRATED SEAM

CROSS REFERENCE TO RELATED APPLICATIONS

This application claims foreign priority under 35 U.S.C. § 119(a)-(d) to German Application No. 10 2015 219 956.8 filed on Oct. 14, 2015, the entire contents of which are hereby incorporated by reference.

FIELD OF THE INVENTION

The invention relates to a superconductor structure comprising a first strip piece with a first width B1, a second strip piece with a second width B2, and a third strip piece with a third width B3,
wherein the strip pieces each have a substrate and a superconducting layer deposited on the substrate,
an end section of the second strip piece and an end section of the third strip piece are connected to the first strip piece via a layer made from a first normally conducting material, wherein the second and third strip piece overlap the first strip piece in the longitudinal direction, wherein the superconducting layers of the second and third strip piece of the superconducting layer of the first strip piece are turned toward one another, wherein a seam is formed between the end sections of the second and third strip pieces, wherein the seam has a path length PL with PL>2*B2 and PL>2*B3,
in particular wherein the layer from the first normally conducting material also extends under the seam. Such a superconductor structure is known from DE 10 2012 218 251 A1. Such superconductors are used to carry lossless electric currents. One important application in particular is magnetic coils for producing high magnetic field, for example for NMR spectrometers and MRI systems (NMR: nuclear magnetic resonance, MRI: magnetic resonance imaging).

BACKGROUND

Superconductors must be operated at a cryogenic temperature below their so-called critical temperature, as above this temperature the superconductor demonstrates only normally conducting behavior. High-temperature superconductors (HTS) such as YBCO (yttrium barium copper oxide) in particular exhibits especially high critical temperatures and can also carry comparatively high electrical currents. It is noticeable, HTS materials as a rule are ceramic materials, so that for mechanical reasons these usually have to be used in the form of strip conductors, thus band-shaped substrates coated with HTS material. HTS coated conductors (tapes) can be fabricated only with limited lengths, so that for important applications such as coils, there is a need to interconnect strip pieces of HTS coated tapes between themselves.

From DE 10 2012 218 251 A1, a superconductor structure is known that has linked strip pieces, in which strip pieces are arranged overlappingly with superconducting layers facing one another. Between the superconducting layers, a normally conducting material is arranged in a way that by the substantially long overlapping lengths no notable ohmic resistance is introduced. The gap at two abutting strip pieces as a rule runs perpendicular to the longitudinal (extension) direction. In one embodiment, however, it is provided that the gap between two abutting strip pieces, which overlap with the same additional strip piece, is formed at an angle of 5-30° to the longitudinal direction of the strip pieces. In this way, inhomogeneities of the critical current in proximity to the gap can readily be bridged. The gap is substantially straight.

U.S. Pat. No. 8,195,260 B2 discloses how to splice two superconducting wires with wedge-shaped edges to one another in an HTS joint, and to overlap them with superconducting straps.

Owing to the gap or the splice point of the strip pieces, according to the observation of the inventors, the current capacity of the respective superconductor structure is generally markedly limited. In addition, a notable power loss usually occurs at the gap or in the area of splice.

SUMMARY

One object of the invention is to achieve a higher current load capacity in a superconductor structure with splicedtogether. A further object is to reduce power loss at the splice points. Yet another object is to render the fabrication of the superconductor structure all-in-all simple and economical.

These objects are achieved by a superconductor structure of the type introduced above, in which the seam extends in the longitudinal direction over an extension region of the superconductor structure, which has a length LBN in which 0.5*PL≥LBN, preferably 0.25*PL≥LBN.

According to one formulation of the present invention, the joint or the seam of two strip pieces spliced to one another is designed such that the path length PL of the seam (that is the length of the joint which results when one advances along the seam from one end to the other) is at least twice as long, preferably four times as long as the length LBN in the longitudinal direction (and main current direction) of the region through which the seam extends in the superconductor structure. At the same time the path length PL is at least twice as large as the widths B2 and B3. The superconductor structure according to this uses a seam with a comparatively long path length.

A corresponding joint with long path length having a geometry according to the invention for the superconducting state of the strip conductor can reduce ohmic losses at the gap, in particular in comparison with a gap of equal width (perpendicular to the course direction of the gap) and shorter path length. In accordance with the long path length PF, there is a large volume region made of superconductor material in proximity to the seam in the second and third strip piece, as well as in the first strip piece.

Further, as a rule LBN≥B2, preferably LBN≥2*B2, and LBN≥B3, preferably LBN≥2*B3, so that in this way a large volume region can be opened up from superconductor material in proximity to the seam.

The dimensioning provided in accordance with an aspect of the present invention cannot be achieved with a seam course that is transverse with respect to the longitudinal direction, but generally substantially straight, as provided in the prior art. In particular, the geometry according to the invention places the path length PF on a comparatively short length LBN. The seam also usually has a wavy and/or jagged course at least in sections. Further, the compact structure or a comparatively short length of LBN avoids connectivity losses in the second and third strip conductor in the region of the seam.

With the geometry of the superconductor structure according to the invention, experimentally a reduced Joulean heat generation at the joints of the strip pieces (thus at the opposite ends of the second and third strip piece) of HTS coated strip (tape) conductors was shown, in particular in comparison with conventional straight joints, transversally to the longitudinal direction. This especially applies when the entire load current IA transported in the superconductor structure is greater than Ic1, but smaller than Ic1+Ic2, and also smaller than Ic1+Ic3, with Ic1, Ic2, Ic3 being critical current strength of the first, second, and third strip conductor. Thus there is a higher critical current strength Ic of the superconductor structure overall. According to another aspect of the invention, Ic can be simply brought close to Ic1+Ic2 and close to Ic1+Ic3.

The inventors suspect that two effects contribute to the improvements according to the invention:

By using the geometry according to the invention, on the one hand a significant diffraction (or divergence with respect to the main flow direction) of current flow lines is produced in the region of the seam from the second to the third strip piece, wherein the current flow directions from the second to the third strip piece can in part greatly differ locally (both among themselves along the seam, as well as on the seam in comparison with regions remote from the seam). According to the invention in particular along the seam locally current flow directions partially or completely opposed to one another from the second to the third strip piece can appear through the first strip piece. In this way, possibly in the superconductor material of the strip pieces, the effective current strength is reduced. Furthermore, in particular seam courses can be selected for which the second and third strip piece partially overlap. A local current flow in the overlap region from the second to the third strip piece, which occurs through the first strip piece, is then at least partially vectorially opposed to the main current direction, and thus locally reduces the effective current strength in the first strip piece. Even without an overlap, a significant divergence of the direction of the local current flow from the second to the third strip piece, which occurs through the first strip piece, from the main current flow direction, can already contribute to increasing the effective current strength in the first strip piece less intensely than with a parallel alignment. All this can contribute to a higher current load capacity of the superconductor structure.

For one thing, according to another aspect of the invention, by using an enlarged used surface, a current split between the first strip piece on the one hand and a second/third strip piece on the other is maintained. The current is better split between the two planes (on the one hand a first strip piece and on the other a second/third strip piece) of the superconductor structure, so that both planes can make an increased contribution to total current load capacity.

The end sections of the second and third strip piece typically overlap together substantially (as far as the seam) the entire length of the first strip piece. Typically the widths B1, B2, and B3 are equal, and typically the strip pieces are the same type as the strip conductor. The superconducting layers of the strip pieces typically are made from HTS material, in particular YBCO.

Note that between the substrate and the superconducting layer, one or a plurality of additional layers can be arranged, for instance buffer layers. The layer made from the first normally conducting material can be supplemented with additional normally conducting layers, so that a multilayer system can be fashioned.

In a preferred embodiment of the superconductor structure according to the invention it is provided that the seam runs through the extension region or a partial region of the extension region, which delimits a partial piece of the extension region in the longitudinal direction, multiple times. In other words, the seam runs in the extension region or in the partial region of the extension region with respect to the longitudinal direction at least once forward and at least once back. In this way an especially long path length of the seam can be accommodated in a compact space, in particular over short length LNB.

Likewise preferred is an embodiment in which one half the seam comprises a non-linear or polygonal course. In this way likewise long path lengths PL can be accommodated on short lengths LNB.

Especially preferred is an embodiment in which the seam has at least one partial section in which a course direction of the seam changes by 180° or more, in particular by 270°. This makes it possible on the one hand to accommodate long path lengths in a small space. On the other hand, however, this ensures that the local current flow directions from the second to the third strip conductor oppose one another at least partially, whereby a reduction of the effective current strengths can be achieved in the strip conductors. In this way an increased current load capacity of the superconductor structure overall can be achieved. Preferably the seam has a plurality, for instance 10 or more, of said partial sections with a 180° change (or more) in the course direction.

In a preferred embodiment it is provided that the seam in at least one partial section is jagged or wavy, in particular the seam runs in the partial section in the form of a wedge with a bilaterally jagged or wavy edge. With a wavy or jagged course, again an especially long path length can be fashioned simply and in a compact space, in particular with a short LBN length.

Also advantageous is an embodiment in which the seam has at least one partial section in which the seam is helical. This makes it possible on the one hand to accommodate long path lengths in a small space. On the other hand, however, this also causes the local current flow directions from the second to the third strip conductor to be opposed to one another at least partially, and also to be partially opposed to the main current direction in the first strip conductor. In this way a reduction in the effective current strength in the strip pieces, in particular in the first trip piece, can be achieved. Accordingly an increased current load capacity of the superconductor structure is generally made possible.

Further preferred is an embodiment that provides that the seam forms a number of substantially similar partial structures, in particular jags or waves, which have a maximal size MG and that the superconductor structure has a current drop distance (SAD) with MG<SAD, wherein SAD is determined as follows:

$$SAD = \sqrt{R_S t / \rho_0}$$

with $R_S$ being the specific contact resistance of a shunt layer and the superconducting layer of the first strip piece in Ohm*m$^2$; t is the thickness or effective thickness of the shunt layer in m; $\rho_0$ is the specific resistance or effective specific resistance of the shunt layer in Ohm*m; wherein the shunt layer comprises at least the layer made from the first normally conducting material. If the shunt layer is a metallic multi-layer, the effective thickness or the effective specific resistance takes the place of the thickness or of the specific resistance of a simple metallic shunt layer. In this embodiment, current flows that come from different (adjacent) partial structures can still interact, in particular can mutually nullify one another if they have penetrated the shunt layer. In this way indirectly an especially low ohmic resistance contribution of the shunt layer is achieved. The maximal size MG is defined as a linear dimension in the plane of the superconducting layer of the second or third strip piece.

In one advantageous embodiment the seam is designed with rounded corners, so that for a minimal radius of curvature [KKR] of the seam, KKR≥0.01*B2 and KKR≥0.01*B3 apply, wherein preferably 0.2*B2≥KKR≥0.01*B2 and 0.2*B3≥KKR≥0.01*B3. Owing to rounded corners or generally an adequately large radius of curvature everywhere on the seam, local current spikes are avoided, so that a high current load capacity of the superconductor structure overall is achieved.

Also advantageous is an embodiment that provides that PL≥5*B2 and PL≥5*B3, preferably PL≥12*B2 and PL≥12*B3, especially preferably PL≥25*B2 and PL≥25*B3. Due to the large path length PF, there is a large volume region of superconductor material close to the seam in the second and third strip piece, as well as in the first strip piece. This volume region can be used for the current transition between the planes, so that both planes can generally make a large contribution to the current load capacity. Further, typically 1000*B2≥PL and 1000*B3≥PL.

A preferred embodiment provides that the second strip piece has a thickness D2 and the third strip piece has a thickness D3, and the seam has a width WT, with 0.01*D2≤WT≤3*D2 and 0.01*D3≤WT≤3*D3, preferably 0.02*D2≤WT≤2*D2 and 0.02*D3≤WT≤2*D3.

The width is the smallest distance from a point on the edge of the seam to the opposite edge of the seam. According to this version, the width is approximately as large as the thickness D2, D3, or even somewhat smaller. With these dimensions, in practice a current transfer was effected without overloading the first strip piece.

Also preferable is an embodiment in which 2*B1≤LBN≤100*B1. With a length LBN of at least 2*B1 there is already sufficient space for a significant elongation of the path length available, without too many successive overlaps having to be carried out. A greater length LBN than 100*B1 usually brings no further improvement in the current load capacity.

One advantageous embodiment provides that the seam is symmetrically shaped with respect to a plane of symmetry that runs along the longitudinal direction through the middle of the superconductor structure and perpendicular to the substrates. In this way an especially uniform split of the currents in the two planes of the superconductor structure is possible, wherein current parts lying obliquely to the main current flow direction and opposing one another can be mutually compensated, and thus reduce the current load of the strip piece.

Also advantageous is an embodiment in which the seam is filled at least in part with a second normally conducting material. By filling of the seam, the ohmic resistance of the seam can be reduced, whereby the seam region in the quench case is better protected from overheating. In addition, some contribution can be made to the current load capacity when the seam has a small width (smaller than 10 microns, for instance) and/or a large path length (less than 10*B1, for instance). The first normally conducting material and the second normally conducting material can be equally selected. The second normally conducting material can in particular fill the seam completely.

A preferable further development of this embodiment in which the second normally conducting material is a low-melting solder with a melting temperature of 80°–350° C., in particular wherein the second normally conducting material contains an alloy having Bi, Sn, Pb, Cd, and/or SN with precipitates of Ag, Au, and/or Cu. These materials are easily processed; a smaller specific resistance is ensured by the precipitates.

In one preferred embodiment, the seam has at least one, preferably two partial sections on which the second strip piece and the third strip piece mutually overlap. A current flow from the second strip piece to the third strip piece through the first strip piece is vectorially at least partially opposed to the base current in the first strip piece in the main flow direction, whereby the current load in the first strip piece is reduced. In this way, a greater current load capacity (without quench) of the superconductor structure can be achieved.

Also advantageous is an embodiment in which the material of the superconducting layers of the strip pieces has an anisotropy of the respective critical currents in the respective layer along the longitudinal direction perpendicular to the longitudinal direction of 1.5 or less, preferably of 1.1 or less. According to this embodiment, the superconducting layers have only a slight anisotropy, or even none at all. This ensures that currents flowing non-parallel to the main current direction ("redirected" through the seam course) in the scope of a current transfer between the second strip piece and the first strip piece or between the first strip piece and the third strip piece under the current load capacity, can be transported without problems in the superconductor material. Hereby in particular an especially high current load capacity is generally attainable.

According to a further aspect of the invention, a superconductor structural group comprises a number of such above-described superconductor structures, in particular wherein two superconductor structures are series connected via their respective second or third strip piece to one another. Structural groups of virtually any length can be formed, with which electric current can be transported without losses. In particular, magnetic coils can be wound for very large current strengths, in particular 10 Tesla or more. The series connection preferably corresponds to the connection between a first strip piece and a second/third strip piece of a superconductor structure.

A further aspect of the present invention involves using an above-described superconductor structure according to the invention and/or an above-described superconductor structural group according to the invention, wherein the first strip piece has a critical current strength Ic1, the second strip piece has a critical current strength Ic2, and the third strip piece has a critical current strength Ic3, and wherein the superconductor structure is acted upon with a load current IA, wherein $Ic1<IA<Ic1+Ic2$ and $Ic1<IA<Ic1+Ic3$, preferably 1.1*Ic1≤IA≤0.9*(Ic1+Ic2) and 1.1*Ic1≤IA≤0.9*(Ic1+Ic3). With these current strengths, the low power loss of the superconductor structure is especially pronounced in comparison with conventional HTS-HTS-joints.

A preferred variant of the use according to the invention provides that the superconductor structure and/or the superconductor structural group is built in a magnetic coil an electric motor or a generator, a transformer or a conductor. With this use, the high current load capacity is especially useful.

Further advantages of the invention follow from the description and the drawing. Likewise, the above-named and still further listed features according to the invention each may find use separately by themselves or collectively in any combination. The displayed and described embodiments are not to be understood as an exhaustive list, but rather have an exemplary character for describing the invention.

BRIEF DESCRIPTION OF THE DRAWINGS

The invention is shown in the drawing and is further explained with reference to the exemplary embodiments.

FIG. 1: a first embodiment of a superconductor structure according to the invention in schematic oblique view, with a helical seam;

FIG. 2: a schematic view of a second embodiment of a superconductor structure according to the invention, with jagged seam;

FIG. 3: a schematic view of a third embodiment of a superconductor structure according to the invention, with wavy seam;

FIG. 4: a schematic view of a fourth embodiment of a superconductor structure according to the invention, with a mirror-symmetrical, overlap forming seam;

FIG. 5: a schematic view of a fifth embodiment of a superconductor structure according to the invention, with a seam forming several loops;

FIG. 9 a schematic top view of an embodiment of a superconductor structure according to the invention, with current flow lines in the region of the seam;

FIG. 10 a schematic longitudinal section of an embodiment of a superconductor structural group according to the invention.

DETAILED DESCRIPTION

Figure 6:
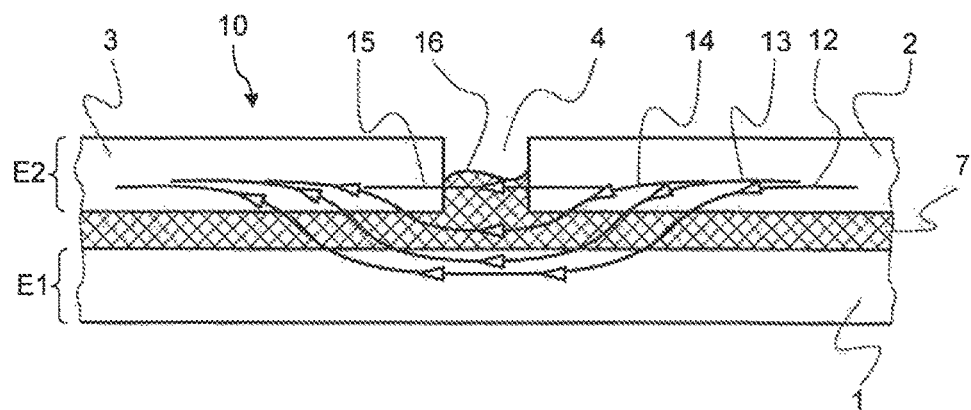
FIG. 6 a schematic longitudinal section of an embodiment of a superconductor structure according to the invention with through layer from a first normally conducting material, wherein the seam is partially filled with a second metallic material.

The present invention relates to a connection of strip conductors with a superconducting coating, in particular HTS coating. The strip pieces here are arranged on one another with superconductor layers facing one another with mutual overlapping, so that there is an overlap over long distances, in particular 10 m or more, both before and after a joint. At a joint, a first strip piece in a first plane bridges the ends of two strip pieces (second and third strip piece) in a second plane. Between the strip pieces of the different planes, a normally conducting layer is arranged, whose ohmic resistance can be neglected owing to a long overlap. The second and third strip piece form a seam (joint) in the second plane. In accordance with an aspect of the invention, the seam is designed such that in sum an improved, in particular approximately galvanic transparency of the joint regions of the second and third strip piece is obtained. This is substantially achieved with a long path length of the seam and a suitable course of the seam with numerous direction changes, in particular with a jagged and/or wavy seam or also with seam sections at which the second and third strip piece mutually overlap.

Typically there are at least 4, preferably at least 8, especially preferably at least 12 direction changes of the seam course by at least 60°, preferably by at least 90°. Furthermore, the seam typically has at least 1, preferably at least 2, especially preferably at least 4 overlapping seam sections.

FIG. 1 shows a first embodiment of a superconductor structure 10 according to the invention. The superconductor structure 10 comprises a first strip piece 1 in a first, here lower plane E1, which overlaps with a second strip piece 2 and a third strip piece 3 in a here upper, second plane E2. The strip pieces 1, 2, and 3 are as a rule of the same design. The widths B1, B2, and B3 of the strip pieces 1, 2, and 3 here are identical and typically are 7-40 mm.

Between the second strip piece 2 and the third strip piece 3 is a seam 4, on which the strip pieces 2, 3 form a joint. The seam 4 is here wound approximately in a helical fashion; the course direction of the seam varies generally ten times by 90° or more, wherein in the interior of the helix the second and third strip piece 2, 3 mutually overlap. The width WT of the seam 4 typically is 10-50 microns.

The strip pieces 1, 2, and 3 each have a substrate 5, here made from sheet steel, on which a superconducting layer 6, here made from YBCO, is deposited. The superconducting layers 6 of the strip pieces 1 on the one side and 2, 3 on the other side face one another. Between the superconducting layers 6, a layer 7 made from a first normally conducting material (an Sn alloy with noble metal precipitates, for example) is arranged. The thickness of the layer 7 is relatively small, typically 5-20 microns, in order to not impede a current transfer between the superconducting layers 6 of the strip conductors 1 and 2, 3. The superconducting layers 6 each have a thickness t of typically 1-3 microns. The strip pieces 2, 3 usually have a thickness D2, D3 of around 200-400 microns, which is substantially determined by the substrate 5.

The seam 4 extends in the longitudinal direction LR (which runs parallel to the main current direction) of the superconductor structure 10 via an extension region 8 with a length LNB. If one advances from the front end NE1 along the seam to the rear seam end NE2, a path length PL is covered.

In the shown embodiment, LNB is twice as long as B2 or B3, and furthermore, PL is around eight times as long as B2 or B3.

FIG. 2 shows a second embodiment of a superconductor structure 10 in top view, so that here above all the seam 4 at the joint is illustrated between the second strip piece 2 and third strip piece 3.

The seam 4 here has a jagged course over two convergent arms, so that the path length in comparison with two straight convergent arms is greatly extended. With the two arms, the seam 4 runs through its extension region 8 in the longitudinal direction LR two times. The seam thus has a wedge-shaped course that is jagged on both sides. On each jag tip and on each jag base, the seam 4 forms an angle of around 90°.

The jags can each be understood as (approximately) equal partial structures 9 of the seam, which repeat several times on the arms. These partial structures 9 have a maximal size (maximum diameter) MG that is smaller than a current drop distance SAD of the superconductor structure, which is provided by $$SAD = \sqrt{R_S t/\rho_0}$$

with $R_S$ being the specific contact resistance of a shunt layer, here the layer 7 made from the first normally conducting material (see FIG. 1) and the superconducting layer 6 (see FIG. 1) of the first strip piece 1 (see FIG. 1) in Ohm*m²; t is the thickness of the shunt layer, here layer 7, in m; po is the specific resistance of the shunt layer, here layer 7, in Ohm*m. With for example $R_S=4*10^{-8}$ Ohm*m², $t=2*10^{-6}$ m and $\rho 0=2*10^{-8}$ Ohm*m, there is a SAD of 2 mm.

Alternatively, for example with $R_S=10^{-10}$ Ohm*m², $t=10^{-5}$ m and $\rho_0=10^{-9}$ Ohm*m (at temperatures of 4.2 K), SAD is 1 mm.

In addition, at an overlapping partial section 27 of the jag flanks it is achieved that a local current direction LSR at the transition from the second strip piece 2 to the third strip piece 3 in the top view has a vectorial component opposed to the main flow direction HSR. Hereby in the first strip piece (covered in FIG. 2) locally the effective current strength is reduced due to the local current direction LSR, which can improve the current load capacity of the superconductor structure 10.

FIG. 3 shows a third embodiment of a superconductor structure 10 according to the invention similar to the embodiment shown in FIG. 2. However, here the corners of the seam 4 are generally rounded, in order to avoid current spikes. In other words, the partial structures 9 here are designed as waves. The smallest radius of curvature KKR here is around 1/20*B2 or 1/20*B3; see also the magnified sector in this regard.

At each wave, the course direction of the seam 4 changes by around 270°. The local current direction LSR at a transition from strip piece 2 to strip piece 3, which is approximately perpendicular to the local seam course, accordingly changes strongly at each wave. This can lead in overlap to a local reduction in the current load, so that the current load capacity of the superconductor structure 10 is increased.

FIG. 4 shows a fourth embodiment of a superconductor structure 10 according to the invention, in which the seam 4 is symmetrical with respect to a mirror plane SE. The mirror plane SE runs through the middle of the superconductor structure 10, parallel to the longitudinal direction LR. The seam 4 here has two overlapping partial sections 27, at which the local current flow direction LSR is in part vectorially counter to the main current flow direction HSR.

Also in the embodiment of FIG. 5, the seam 4 of the superconductor structure 10 is mirror-symmetrical with respect to a mirror plane SE. The seam 4 is in a dendritic shape, with a plurality of loop-shaped partial sections 11, at which the course direction changes in each case by more than 180°, cf. in this regard the directional arrows shown on a loop. In this way through the seam 4, a plurality of overlapping partial sections 27 are formed.

FIG. 6 shows in a longitudinal section through a superconductor structure 10 as an example the course of currents in the region of the seam 4 at the change from the second strip piece 2 to the third strip piece 3, between the planes E1 and E2.

Electrical currents, that here run in the strip piece 2 in the plane E2 toward the seam 4, largely penetrate the layer 7 made from the first normally conducting material and submerge in the first strip piece 1 in the plane E1 under the seam 4. Past the seam 4, they go back to the upper plane E2 into the third strip piece 3, cf. partial currents 12, 13. A part of the current, cf. partial current 14, penetrates only into the layer 7 made from the first normally conducting material, without penetrating the first strip piece 1. A further part of the current here also can penetrate a (partial) filling 16 of the seam 4 from a second normally conducting material, such as can be used for the layer 7.

In the first plane E1 a base current also flows—apart from the partial currents 12, 13—which is re-directed at the seam 4 (not further illustrated). This base current in the main current direction and the partial currents 12, 13 may not in the (vector) sum exceed the critical current Ic1 of the first strip piece 1 locally under the seam 4. Therefore, it is advantageous if the seam 4 runs transversely to the main current direction or is even overlapping, because then the current load in the first plane E1 can be kept low.

Figure 7:
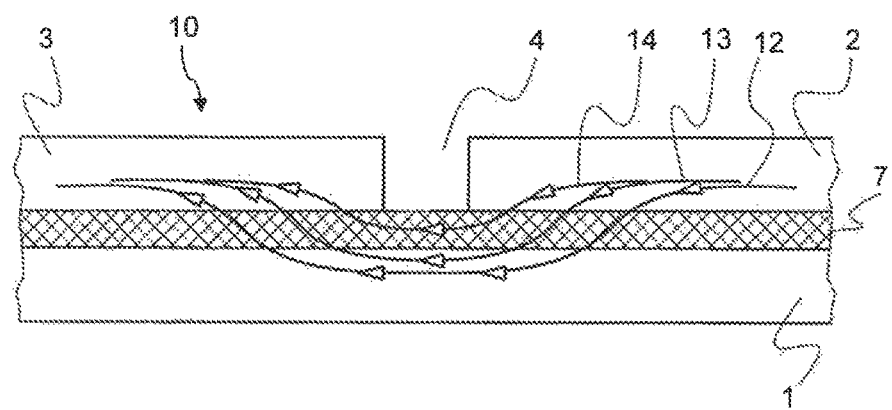
FIG. 7 a schematic longitudinal section of an embodiment of a superconductor structure, with through layer from a first normally conducting material, with unfilled seam.

FIG. 7 illustrates an embodiment of a superconductor structure 10 similar to the embodiment of FIG. 6 but in which the seam (the joint) 4 is not filled. In this case only the partial currents 12, 13 through the first strip piece 1 and a partial current 14 through the layer 7 are possible.

Figure 8:
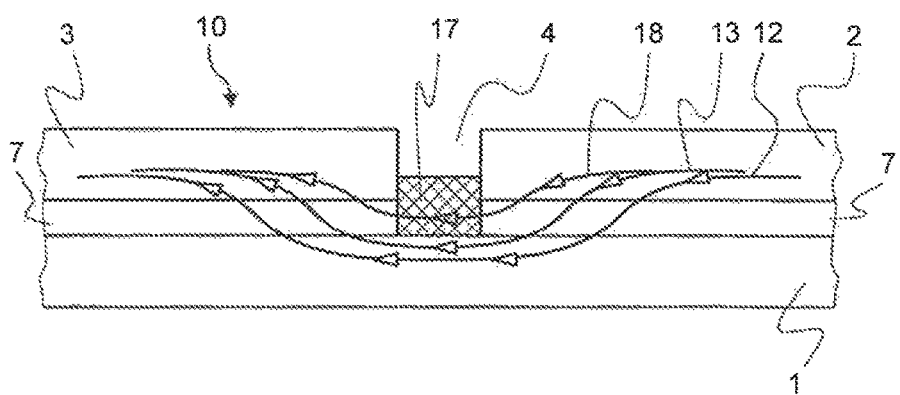
FIG. 8 a schematic longitudinal section of an embodiment of a superconductor structure, with a layer interrupted at the seam made from a first normally conducting material.

In the embodiment of a superconductor structure 10 of FIG. 8, which is likewise similar to the embodiment of FIG. 6, the layer 7 is interrupted in the region of the seam 4. But filling 17 made from a second superconducting material is provided, which extends over the height of the layer 7, as well as a part of the height of the strip pieces 2, 3. In this case, partial currents 12, 13 through the first strip piece 1 and a partial current 18 through the layer 7 and the filling 17 can arise.

FIG. 9 shows in top view the current flow 26 at a superconductor structure 10 according to the invention in the region of a seam 4, which runs transversely to a main current flow direction HSR (simultaneously the longitudinal direction of the superconductor structure 10). The current flow 26 is broken or diverted by the seam 4, typically so that the current flow 26 is approximately perpendicular to the local seam 4. Hereby the current flow 26 increases a total current flow in the first strip piece (comprising a base current flow in the main current flow direction and the current flow 26) in the main current flow direction HSR effectively less intensely in comparison with an (additional) current flow in the main current flow direction HSR. This effect is greater the more intense the divergence with respect to the main current flow direction at the seam 4; at an overlapping seam section (not shown), the total current flow in the main current flow direction HSR is even reduced.

Preferably the superconducting layers of the strip pieces and in particular of the first strip piece, regarding to the respective critical current strength Id, Ic2, Ic3 are approximately isotropic (that is, the critical current $Ic^{II}$ parallel to the main current flow direction HSR is at most slightly over the critical current $Ic^{\perp}$ perpendicular to the HSR, for example with $Ic^{II}/Ic^{\perp} \leq 1.5$ or preferably $Ic^{II}/Ic^{\perp} \leq 1.1$), so that the divergence can also be readily used for a higher current load capacity.

FIG. 10 shows as an example a superconductor structural group 19 according to the invention, comprising a number of linked strip pieces 1, 2, 3, 21, 22 with superconducting layers 6 or comprising a number of superconductor structures 10, 20, 30 according to the invention.

A superconductor structure 10 is formed with the strip pieces 1 (as first strip piece), 2 (as second strip piece), and 3 (as third strip piece), and with the seam 4 at the joint of the strip pieces 2 and 3.

A further superconductor structure 20 is formed by the strip pieces 3 (as first strip piece), 1 (as second strip piece), and 21 (as third strip piece) with the seam 23 at the joint of strip pieces 1 and 21.

Yet another superconductor structure 30 is formed by the strip pieces 21 (as first strip piece), 3 (as second strip piece), and 22 (as third strip piece), with seam 24 at the joint of the strip pieces 3 and 22.

It is understood that the superconductor group 19 can be analogously extended by further strip pieces analogously. With the superconductor group 19, very long superconducting lines can be designed with high current load capacity.

The invention claimed is:

1. A superconductor structure, comprising: a first strip piece having a first width B1, a second strip piece having a second width B2, and a third strip piece having a third width B3,
   wherein the first, second and third strip pieces each comprises a substrate and a superconducting layer deposited on the substrate,
   wherein one end section of the second strip piece and one end section of the third strip piece are connected via a layer made from a first normally conducting material to the first strip piece, wherein the second and third strip pieces overlap with the first strip piece in a longitudinal direction of the structure,
   wherein the superconducting layers of the second and the third strip pieces face the superconducting layer of the first strip piece,
   wherein the end sections of the second and the third strip pieces form a seam, wherein the seam has a path length PL such that PL>2*B2 and PL>2*B3,
   and
   wherein the seam extends in the longitudinal direction over an extension region of the superconductor structure having a longitudinal length LBN such that 0.5*PL≥LBN.

2. The superconductor structure according to claim 1, wherein the seam passes through the extension region or a partial region of the extension region, which selects a section of the extension region in the longitudinal direction, multiple times with respect to the longitudinal direction.

3. The superconductor structure according to claim 1, wherein at least half of the seam has a non-linear and/or polygonal course.

4. The superconductor structure according to claim 1, wherein the seam has at least a partial section, in which a course direction of the seam changes by at least 180°.

5. The superconductor structure according to claim 1, wherein the seam in at least one partial section thereof is jagged or wavy.

6. The superconductor structure according to claim 5, wherein the seam in the partial section is in a wedge form with jagged or wavy edges on both sides of the seam.

7. The superconductor structure according to claim 1, wherein the seam has at least a partial section in which the seam is helical.

8. The superconductor structure according to claim 1, wherein:
   the seam forms a number of substantially identical partial structures, which have a maximal size MG, and
   the superconductor structure has a current drop distance SAD, with MG<SAD
   wherein SAD is determined as follows:
   $$SAD = \sqrt{R_S t/\rho_0}$$
   where $R_S$ is the specific contact resistance of a shunt layer and the superconducting layer of the first strip piece in Ohm*m²; t is the thickness or effective thickness of the shunt layer in m; $\rho_0$ is the specific resistance or effective specific resistance of the shunt layer in Ohm*m; and
   wherein the shunt layer comprises at least the layer made from the first normally conducting material.

9. The superconductor structure according to claim 1, wherein the seam is formed with rounded corners,
   so that for a minimal radius of curvature KKR of the seam,
   $$KKR \geq 0.01*B2 \text{ and } KKR \geq 0.01*B3,$$

10. The superconductor structure according to claim 9, wherein $0.2*B2 \geq KKR \geq 0.01*B2$ and $0.2*B3 \geq KKR \geq 0.01*B3$.

11. The superconductor structure according to claim 1, wherein
   $$PL \geq 5*B2 \text{ and } PL \geq 5*B3.$$

12. The superconductor structure according to claim 11, wherein PL≥25*B2 and PL≥25*B3.

13. The superconductor structure according to claim 1, wherein the second strip piece has a thickness D2, the third strip piece has a thickness D3, and the seam (4, 23, 24) has a width WT,
   and wherein
   $$0.01*D2 \leq WT \leq 3*D2 \text{ and } 0.01*D3 \leq WT \leq 3*D3.$$

14. The superconductor structure according to claim 13, wherein 0.02*D2≤WT≤2*D2 and 0.02*D3≤WT≤2*D3.

15. The superconductor structure according to claim 1, wherein 2*B1≤LBN≤100*B1.

16. The superconductor structure according to claim 1, wherein the seam with respect to a plane of symmetry, which runs along the longitudinal direction through a center of the superconductor structure and perpendicular to the substrates, is symmetrically formed.

17. The superconductor structure according to claim 1, wherein the seam is filled at least partially with a second normally conducting material.

18. The superconductor structure according to claim 17, wherein the second normally conducting material is a low-melting solder with a melting temperature of 80°-350° C.

19. The superconductor structure according to claim 18, wherein the second normally conducting material is an alloy containing Bi, Sn, Pb, Cd, and/or Sn with precipitates of Ag, Au, and/or Cu.

20. The superconductor structure according to claim 1, wherein the seam has at least one partial section at which the second strip piece and the third strip piece mutually overlap.

21. The superconductor structure according to claim 1, wherein the material of the superconducting layers of the strip pieces has an anisotropy of the respective critical currents ($Ic^{\parallel}$, $Ic^{\perp}$) in the respective layer along the longitudinal direction to perpendicular to the longitudinal direction of 1.5 or less.

22. A superconductor structural group comprising at least two superconductor structures according to claim 1,
   wherein the two superconductor structures are electrically series connected to one another via their respective second or third strip piece.

23. The superconductor structure according to claim 1, wherein the first strip piece has a critical current strength Ic1, the second strip piece has a critical current strength Ic2, and the third strip piece has a critical current strength Ic3, and wherein the superconductor structure is acted on with a load current IA, wherein
   $$Ic1 < IA < Ic1+Ic2 \text{ and } Ic1 < IA < Ic1+Ic3.$$

24. The superconductor structure according to claim 23, wherein the superconductor structure, is an electronic component incorporated into
   a magnetic coil,
   an electric motor or a generator,
   a transformer, or
   a conductor.

25. The superconductor structure according to claim 23, wherein 1.1*Ic1≤IA≤0.9*(Ic1+Ic2) and 1.1*Ic1≤IA≤0.9*(Ic1+Ic3).

26. The superconductor structure according to claim 1, wherein the layer made from the first normally conducting material extends under the seam, and wherein $0.25*PL \geq LBN$.

* * * * *